US009970106B2

(12) United States Patent
Goeres et al.

(10) Patent No.: US 9,970,106 B2
(45) Date of Patent: May 15, 2018

(54) CVD SYSTEM HAVING PARTICLE SEPARATOR

(71) Applicant: AIXTRON SE, Herzogenrath (DE)

(72) Inventors: Wilfried Goeres, Hückelhoven (DE); Peer Lehnen, Baesweiler (DE); Heinrich Mallmann, Herzogenrath (DE)

(73) Assignee: AIXTRON SE, Herzogenrath (DE)

( * ) Notice: Subject to any disclaimer, the term of this patent is extended or adjusted under 35 U.S.C. 154(b) by 412 days.

(21) Appl. No.: 14/762,396

(22) PCT Filed: Jan. 16, 2014

(86) PCT No.: PCT/EP2014/050769
§ 371 (c)(1),
(2) Date: Jul. 21, 2015

(87) PCT Pub. No.: WO2014/114549
PCT Pub. Date: Jul. 31, 2014

(65) Prior Publication Data
US 2015/0322566 A1    Nov. 12, 2015

(30) Foreign Application Priority Data

Jan. 25, 2013  (DE) ........................ 10 2013 100 734
Jan. 7, 2014   (DE) ........................ 10 2014 100 092

(51) Int. Cl.
*C23C 16/44*     (2006.01)
*B01D 46/00*     (2006.01)
(Continued)

(52) U.S. Cl.
CPC ...... *C23C 16/4412* (2013.01); *B01D 46/0075* (2013.01); *F01N 3/022* (2013.01);
(Continued)

(58) Field of Classification Search
CPC ............ C23C 16/4412; F01N 2450/30; F01N 3/0233; F01N 3/022; F01N 3/0237;
(Continued)

(56) References Cited

U.S. PATENT DOCUMENTS 4,792,344 A    12/1988  Belcher et al.

FOREIGN PATENT DOCUMENTS

CH        526327 A      8/1972
CN       1090520 A      8/1994
(Continued)

OTHER PUBLICATIONS

Search Report dated Oct. 26, 2016, from the Chinese Patent Office, for Chinese Patent Application No. 2014800056838 (filed Jan. 16, 2014), 2 pages.
(Continued)

*Primary Examiner* — Rudy Zervigon
(74) *Attorney, Agent, or Firm* — Ascenda Law Group, PC (57) ABSTRACT

The invention relates to a device for coating substrates in a process chamber (8) of a reactor housing (1), having a gas inlet member (11) for introducing process gases into the process chamber (8), having a gas outlet member (10) for discharging an exhaust gas stream from the process chamber (8) into a particle filter (4), which is disposed in a particle separator housing (3) and has a porous filter medium (16) for out-filtering particles from the exhaust gas stream, which form during a reaction of the process gases. In order to improve the filtering performance of a particle filter at a CVD or PVD device and to specify a suitable particle filter for this intended purpose, the invention suggests that the pore size and the surface quality of the filter medium (16) are selected in such a manner that the particles located in the exhaust gas stream adhere to the surface of the filter medium (16), however do not penetrate the filter medium (16), and
(Continued)

the particles grow to conglomerates outside of the filter medium (16), and a mass acceleration device is provided for cleaning the particle filter (4) by mechanically removing the conglomerates.

14 Claims, 6 Drawing Sheets

(51) Int. Cl.
  *F01N 3/022* (2006.01)
  *F01N 3/023* (2006.01)
(52) U.S. Cl.
  CPC .......... *F01N 3/0233* (2013.01); *F01N 3/0237* (2013.01); *F01N 2450/30* (2013.01); *Y02C 20/30* (2013.01)
(58) Field of Classification Search
  CPC ... Y02C 20/30; B01D 46/0075; F02D 41/029; F02D 41/0007; F02D 2200/0812; F02D 41/0235; F02D 41/0275; F02D 13/0203; F02D 13/023; F02D 13/0269; F02D 15/04; F02D 2009/0279; F02D 2041/001; F02D 2041/026; F02D 2200/0802; F02D 41/0065; F02D 41/0082; F02D 41/028; F02D 41/1446; F02D 41/1448; F02D 41/222; F02D 41/403; F02D 9/06; F02D 19/084; F02D 2041/0017; F02D 2041/0075; F02D 21/08; F02D 41/0002; F02D 41/0055; F02D 41/0072; F02D 41/021; F02D 41/0245; F02D 41/0285; F02D 41/08; F02D 41/1401; F02D 41/1408; F02D 41/1441; F02D 41/18; F02D 41/2441; F02D 41/3035; F02D 41/405
  USPC .................. 118/715; 156/345.1; 422/168
  See application file for complete search history.

(56) References Cited

FOREIGN PATENT DOCUMENTS

| | | |
|---|---|---|
| CN | 2458049 Y | 11/2001 |
| CN | 1962025 A | 5/2007 |
| CN | 201445872 U | 5/2010 |
| EP | 1293240 A1 | 3/2003 |
| JP | 2002-319784 A | 10/2002 |
| JP | 2009034648 A | 2/2009 |
| WO | 2009/038326 A2 | 3/2009 |

OTHER PUBLICATIONS

International Preliminary Report on Patentability dated Jul. 28, 2015, from The International Bureau of WIPO, for International Patent Application No. PCT/EP2014/050769, 9 pages.

International Search Report and Written Opinion, from the European Patent Office (dated Apr. 14, 2014), PCT/EP2014/050769 (filed Jan. 16, 2014), 15 pgs (including English translation).

CVD SYSTEM HAVING PARTICLE SEPARATOR

RELATED APPLICATIONS

This application is a National Stage under 35 USC 371 of and claims priority to International Application PCT/EP2014/050769 filed 16 Jan. 2014, which claims priority to DE Application 10 2013 100 734.1 filed 25 Jan. 2013, and claims priority to DE Application 110 2014 100 092.7 filed 7 Jan. 2014, each of which is incorporated herein by reference.

The present invention relates to a device for coating substrates in a process chamber of a reactor housing, having a gas inlet member for introducing process gases into the process chamber, having a gas outlet member for discharging an exhaust gas stream from the process chamber into a particle filter, which is disposed in a particle separator housing and has a porous filter medium for out-filtering particles formed during a reaction of the process gases from the exhaust gas stream.

CVD reactors are known, in particular, from DE 10 2004 062553 A1, DE 100 55 182 A1, DE 102 47 921 A1, DE 10 2009 043840 A1 or US 2011/0237051 A1.

A generic CVD reactor forms a device for coating substrates. The device has a process chamber, which is disposed in a reactor housing. The process chamber has a gas inlet member, through which one or a plurality of process gases are Introduced into the process chamber. A chemical or physical reaction occurs within the process chamber. For this purpose, the process chamber may be heated to a higher process temperature. A substrate holder, upon which rests one or a plurality of substrates, which are being coated, is located within the process chamber. The layer formation is a consequence of the reaction of the at least one process gas in the gas phase or of a condensation from the gas phase. Particularly in a MOCVD coating process, in which two different process gases are introduced into the process chamber, the process gases may react with each other in the gas phase. In this reaction, particles may form. A particle formation in the gas phase does, however, not only occur in a heterogeneous reaction. A particle formation may also occur in a homogeneous gas phase reaction. Such particles are transported out of the process chamber in the exhaust gas stream. A further source for a particle formation may be a cold trap disposed in flow direction downstream of the gas outlet member, by which the exhaust gas stream is discharged from the process chamber. In this cold trap, the exhaust gas is, for example, cooled to the temperature of the liquid nitrogen. This cooling may result in a particle formation by chemical reaction on the one hand but also by condensation on the other. These particles located in the exhaust gas stream are out-filtered out of the exhaust gas stream by a particle filter. For this purpose, the particle filter is disposed in a particle separator housing.

In powder coating devices, in which a powder is used to coat work pieces, filter elements are used to separate the powder from the gas stream. For such a device, the publication DE 10246126 A1 suggests a mechanical filter cleaning, in which a vibration device brings the filter element in vibration, so that powder settled on the filter surface may loosen from the filter medium. Publications US 2002/0106461 A1, US 2006/0081188 A1 or U.S. Pat. No. 3,791,341 describe a similar device. The cleaning of filters of powder coating systems by applying a gas counter stream or by using pulsed gas streams is known from the U.S. Pat. No. 4,913,085 or the EP 0129053 B1.

Is has been observed in a generic CVD device that fine particles transported in the exhaust gas stream agglomerate at the surface of the filter medium of the particle filter into conglomerates. A particle growth virtually occurs at the surface of the particle filter. The associated coverage of the surface of the filter medium results in compromising the filtering performance of the particle filter.

The object of the present invention is to improve the filtering performance of a particle filter at a CVD or PVD device and to specify a suitable particle filter for this intended purpose.

This object is achieved first and substantially by the coating device recited in Claim 1 and the particle separation device recited in Claim 7. The dependent claims illustrate advantageous further refinements of the present invention. According to the present invention, means for cleaning the particle filter are provided. These means are of a mechanical nature and have such an effect on the filter medium that the conglomerates formed thereon loosen from the filter medium. According to the present invention, the filter medium has a pore size or surface quality that is selected in such a manner that the particles located in the exhaust gas stream adhere to the surface of the filter medium, however do not penetrate the filter medium. The pore size or the surface quality of the filter medium is adjusted in such a manner that the particles grow to conglomerates merely outside of the filter medium.

The particle filter according to the present invention is able to be set in motion by a mass acceleration device. The mass acceleration device may have a mass, which may be set in motion. This results in an impulse transfer to the particle filter, and the impulse transfer has maximum forces, and the mass acceleration device thus is to generate high accelerations, that is, changes in velocity in the shortest possible time. In one preferred refinement, the mass acceleration device is formed by a hammer device including a mass forming a hammer, which is accelerated in order to strike an anvil. In this instance, the mass acceleration device sets the hammer in motion and strikes the anvil. It may be a drop hammer device. For this purpose, the particle filter, which is elastically connected to the particle separator housing, has a falling mass, which is mechanically lifted and then dropped. The falling mass falls onto an anvil and transfers a strike to the cartridge so that the particles adhering to the cartridge walls loosen and fall down. In a preferred refinement, it is provided that the hammer device is attached to a base body, for example, a base plate of the particle filter. The base body is the carrier of the filter cartridge and carrier of a body formed as a cavity, which forms the hammer device. A mass displaceable into the vertical direction is located within the cavity. The mass may be lifted in a piston-like manner within the cylinder-shaped cavity by infeeding a gas, for example, air. The mass is dropped from the elevated position, which may occur, for example, by opening a valve. The mass then strikes the bottom of the cavity, which forms an anvil. The strike is transferred via the base body to the filter cartridge. The mass, however, may also be accelerated in the vertical direction upwards to strike the ceiling of the cavity, which then forms an anvil. Alternatively, the particle filter vis-à-vis the particle separator housing may, for this purpose, be brought in vibration. The vibration has such a frequency and such an amplitude that conglomerates formed on the surface of the filter medium loosen from the filter medium and, owing to the force of gravity affecting them, fall to the bottom of the particle separator housing. One or a plurality of particle filters may be provided. The particle filters may be respectively formed by filter cartridges. A filter cartridge preferably and substantially has the shape of a cylinder, and the filter cartridge is formed as a hollow cylinder. The wall of the hollow cylinder is formed by the filter medium. The filter medium is preferably pleated. It may be a filter paper. The filter medium, however, may also be a nonwoven polymer fabric. The filter medium may be coated. In particular, it may be coated with Teflon. The one or plurality of cartridges extend preferably in the vertical direction. They are elastically attached at their underside to the bottom of the particle separator housing. An elastic bearing element formed by a silicone bellow serves this purpose. The silicone bellow has the shape of a pipe, by which the filtered exhaust gas stream may exit the filter cartridge. Each filter cartridge may be individually connected by an elastic bearing element to the particle separator housing. The vibration device may vibrate the exposed, upper end of the particle filter. A single vibration device may be provided, which vibrates a plurality of particle filters. In this instance, the particle filters extending in a parallel manner to one another may be connected at their upper sides, hence, at their exposed ends to one another. The vibration device, which may be disposed on a housing seated on top of the particle filters, may have an electric motor that actuates eccentric flywheel masses in a rotary manner. For this purpose, an excitation frequency of approximately 3,000 Hz may be generated. Alternatively or in combination therewith, an ultrasonic exciter may, however, also be provided to vibrate the particle filter. The vibration device may, however, also be made-up of an electro magnet and a ferromagnetic flywheel mass. The flywheel mass is vibrated when the electromagnet is charged with an alternating current. The silicone bellow, by which the filtered exhaust gas stream exits the particle filter, has such an interior diameter that the pressure loss is less than 10 mbar. The filter medium has a substantially smooth surface. The filter medium is capable of being exposed to temperatures of at least 150° C. The porosity of the filter medium or the surface quality of the filter medium is selected in such a manner that the particles during the gas phase adhere to the surface of the filter medium, however, do not penetrate the pores of the filter medium. The particles may grow to conglomerates at the surface of the filter medium. In this instance, the conglomerates to not grow into the pores of the filter medium, so that they may, as a consequence of the vibrations, be shaken off the filter medium. The score lines, which substantially run on a circular arc line, may have a distance of 10 to 12 mm. The vibration amplitude may be in the area of 1 mm. The vibration device brings the particle filter, which is connected at its lower end in an elastically resettable manner to the bottom of the particle separator housing, into a pendulous movement. The vibration device may bring the exposed end located opposite of the end of the particle filter connected to the bottom in a free vibration. In this instance, the particle filter or a plurality of particle filters rigidly connected to one another protrude into the interior of the particle separator housing. A shared vibration device vibrates a plurality of particle filters rigidly connected to one another.

The object mentioned at the outset is also achieved in that the filter cartridge is blown out from the inside to the outside against the conventional direction of the gas stream. For this purpose, means are provided to infeed a gas stream into the filter cartridge on the downstream side of the filter medium. Such a gas stream may, when using a valve disposed in the exhaust gas pipe, which is to be closed, generate the gas counter stream that is, for example, infed into the interior of the cartridge, so that a gas counter stream is able to flow from the inside to the outside. The gas, by which the cartridges may be blown out from the inside to the outside against the conventional direction of the gas stream, may be nitrogen. Providing such a possibility of an additional gas feed, a pressure surge may also be generated in the interior of the cartridge, so that the filter material is stretched and, for this reason, the conglomerates fall off on the exterior side of the filter material. The pressure surge may also be generated in a different manner, for example, by a cylinder piston unit. It is further possible to use another mechanical excitation to induce an elastic deformation of the filter material. It particularly may be provided that merely the filter material is vibrated. This may be carried out by a frequency exciter, for example, by an ultrasonic exciter.

Furthermore, the present invention relates to using a particle separator having a vibration device for bringing particle filters at a CVD device in vibration, particularly at a MOCVD device, in which an organometallic gallium compound and a hybrid are used; however, the use may also occur at a PVD device. Preferably, the particle separator is used in a device, by which gallium nitrate is separated by using an organometallic gallium compound and ammonia. In particular, mechanical means are provided, which use sets the particle filter or the filter medium in motion in such a manner that the conglomerates adhering to the surface of the filter medium loosen from the filter medium.

In the following, exemplary embodiments of the present invention are described on the basis of appended drawings. Shown are.

Figure 1:
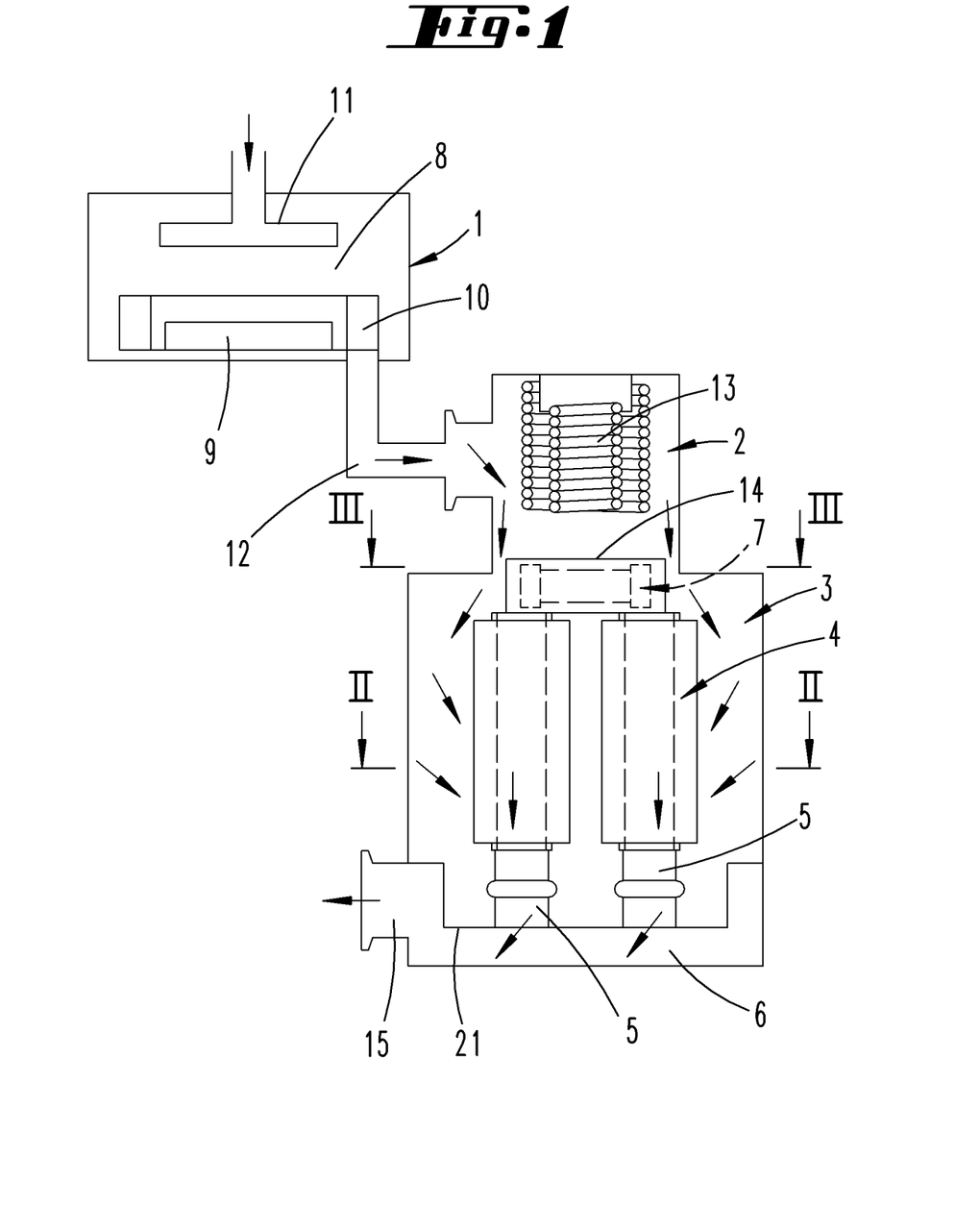
FIG. 1 shows schematically a CVD reactor having a particle separator in a first exemplary embodiment.

A CVD reactor 1 has a gas inlet member 11, which is connected to a gas supply unit not illustrated via a pipe connection. The gas supply unit delivers the process gases, which are introduced to a process chamber 8 of CVD reactor 1 by means of gas inlet member 11. Substrates, which are to be coated, are located on a heatable susceptor 9. The process gases decompose pyrolytically in the gas phase or on the surfaces of the substrates situated on top of susceptor 9, so that a single crystalline layer grows in this location. Preferably, a carrier gas, for example, hydrogen, and reactive gases are infed by gas inlet member 11. In order to separate gallium nitrate, ammonia and an organometallic gallium compound, for example, TMGa are infed into process chamber 8. The process gases condensate not only on the substrate surfaces as reaction product GaN. The process gases react with one another also in the gas phase above susceptor 9, so that particles form.

An exhaust gas stream, which may include particles, is led out of process chamber 8 through gas outlet member 10 and brought into a cold trap 2 via a gas line 12. A cooling coil 13, which, for example, is passed through by liquid nitrogen, is located in cold trap 2. The exhaust gas is cooled. In this instance, a condensation may occur, so that particles form also when cooling the exhaust gas.

Below cold trap 2, a particle separator housing 3 is located. Particle separator housing 3 has a gas outlet 15, by which particle separator housing 3 is connected to a vacuum device, for example, a vacuum pump. This vacuum pump, not shown, is able to maintain the total pressure in process chamber 8, in cold trap 2 and in particle separator housing 3 at a level of between 1 and 950 mbar. The total pressure may, however, also be maintained at a vacuum level of between, for example, 1 and 5 mbar.

A gas outlet channel 6 is assigned to bottom 21 of particle separator housing 3. This gas outlet channel 6 runs below bottom 21 and flows into gas outlet 15. In the exemplary embodiment, three particle filters having the shape of respectively one filter cartridge 4, rest on bottom 21. On the side located opposite of bottom 21, particle separator housing 3 has an opening, through which the exhaust gas may enter particle separator housing 3. Cold trap 2 is located immediately above this opening.

Filter cartridges 4 have a cylindrical shape and a gas exit opening, through which the filtered exhaust gas may flow into gas outlet channel 6. Filter cartridges 4 are respectively connected via a silicone bellow 5 to bottom 21. The filtered exhaust gas stream may flow from the interior of filter cartridge 4 through the pipe opening of silicone bellow 5 into gas outlet channel 6.

The wall shell of hollow cylindrical filter cartridge 4 is made up of a thin-walled, pleated filter medium 16. From FIG. 2 it may be concluded that filter medium 16 is pleated in a zigzag manner and forms interior score lines 18 and exterior score lines 17, which run parallel to each other. The distance between score lines 17 or 18 ranges between 10 and 12 mm.

Figure 3:
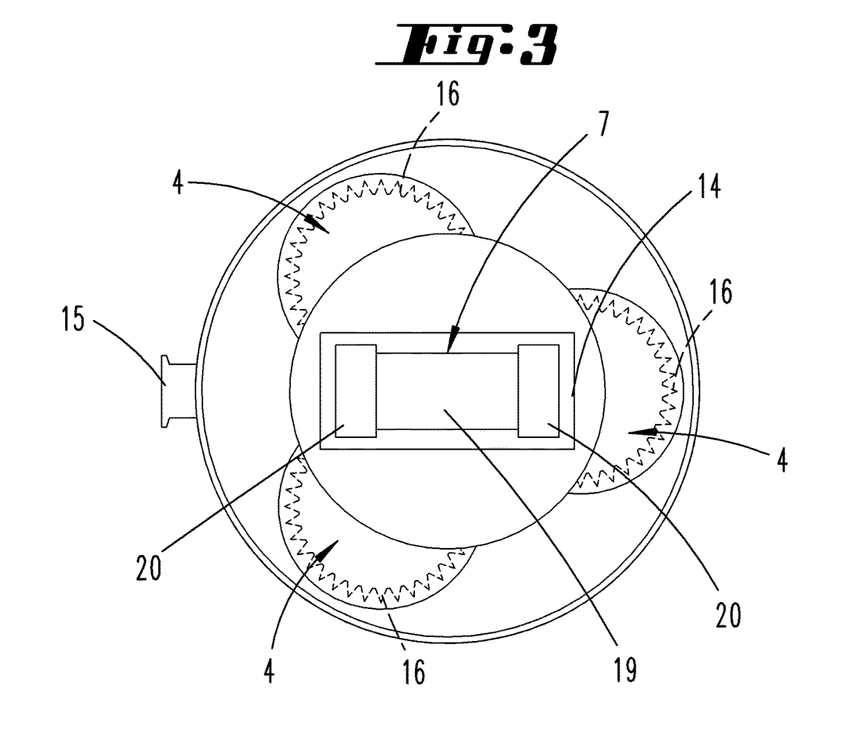
FIG. 3 shows a section according to line III-III in FIG. 1.
Figure 4:
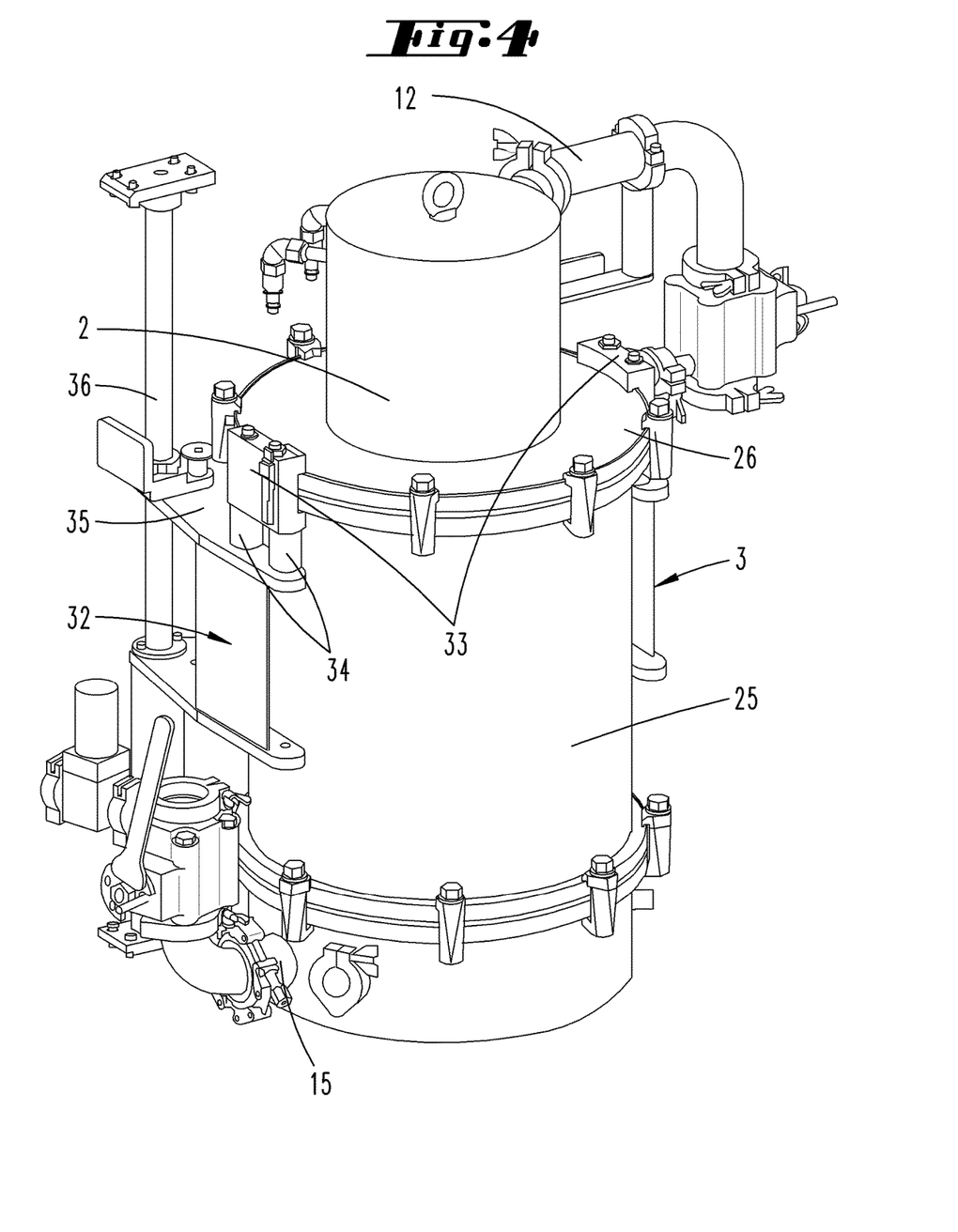
FIG. 4 is a view showing a second exemplary embodiment of a particle separator.

Silicone bellows 5 form elastic bearing elements, by which filter cartridges 4 are vibratably attached to bottom 21. The exposed ends of three filter cartridges 4 pointing upward are connected to one another by a housing 14 of a vibration device 7. Within housing 14 of vibration device 7, an electric motor 19 is located, on which shaft flywheel masses 20 are disposed. Flywheel masses 20 are situated in such an excentric manner to the rotary axis of the shaft of electric motor 19 that a rotation of electric motor 19 vibrates the ensemble of three filter cartridges 4, which has an amplitude of approximately 1 mm. The vibration frequency is preferably at approximately 50 to 60 Hz. It may also, however, go up to 3,000 Hz. It is, however, also possible to regulate filter cartridges 4 in the ultrasonic range. Vibration device 7 provided in the exemplary embodiment brings an arrangement made-up of three filter cartridges in a pendulous vibration. It is, however, also provided that filter cartridge 4 or an arrangement of filter cartridges is brought into a longitudinal vibration along the axis of filter cartridge 4.

Filter medium 16 is a thin-walled, porous material. The pore size of the filter medium ranges between 1 and 50 µm. A pore size of approximately 10 µm is preferred. The filter medium may be made-up of paper or material based on paper. It is also provided that the filter medium is a nonwoven polymer fabric. The filter medium may be coated. Preferably, it is coated with Teflon. The surface of the filter medium has such a quality that particles located in the exhaust gas stream may accumulate at said surface. These ultra-small particles adhere to the surface of filter medium 16 without growing into the pores of filter medium 16. Individual, ultra-fine particles adhering to the surface of filter medium 16 form growth nuclei, to which other ultra-fine particles may adhere. In this instance, conglomerates form, which may reach a sizes of 0.5 to 5 mm. The vibration frequency and vibration amplitude are adjusted in such a manner that the conglomerates loosen from the surface of filter medium 16, as soon as they have reached a size that is in the millimeter range. They then fall to bottom 21 of particle separator housing 3. As the conglomerates formed at the surface of filter medium 16 loosen from filter medium 16, the surface taken up before by the conglomerates is again available as a gas passage surface for the exhaust gas. In this manner, the efficiency of the particle filter increases.

The conglomerates shaken off from filter medium 16 gather on bottom 21 of particle separator housing 3. The particles may be removed through a service port not illustrated.

The vibration motor may also be situated within the filter cartridge, thus, on the downstream side of filter medium 16.

Figure 2:
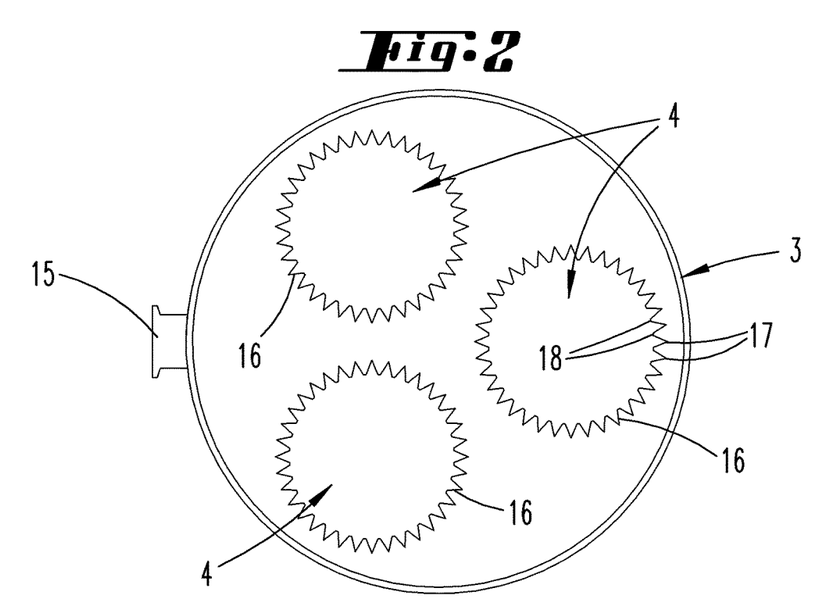
FIG. 2 shows a section according to line II-II in FIG. 1.

In an exemplary embodiment not shown, in which the filter cartridge or the device substantially has the same structure as shown in FIGS. 1 through 3, means are provided for infeeding a gas stream into the interior of filter cartridge 4. For example, an additional gas feeding line may flow into gas outlet channel 6. A valve, which is open during the separation operation, may be provided at gas outlet 15. If this valve is closed, feeding a gas into gas outlet channel 6 results in an over pressure within filter cartridge 4. This results in an elastic deformation of filter medium 16 in the outward direction. As a result of this deformation, the conglomerates attached at the outside of filter medium 16 may fall off. In conjunction with the compressed air supply, a gas stream is generated in the opposite direction, thus, from the inside to the outside, by filter medium 16. The additional supply line, for example, into gas outlet channel 6 but also directly into filter cartridge 4, may, in addition to the gas stream in the opposite direction of the conventional gas stream, also simply generate a pressure surge in the interior of the cartridge. As a result of this pressure surge, the filter material expands. This elastic deformation results in the conglomerates to loosen from the surface of filter medium 16.

The pressure surge may also be generated by a piston cylinder unit. For example, the piston cylinder unit may be connected to gas outlet channel 6. The cylinder is open in the direction of gas outlet channel 6. If the piston is displaced within the cylinder, gas is, depending on the direction of displacement, either displaced into gas outlet channel 6 or out of gas outlet channel 6. A respectively rapid displacement results in a pressure surge. A vibration of the piston results in a mechanical excitation of the filter material, so that said filter material elastically deforms. It may concern a periodic excitation, which brings filter medium 16 in vibration. Other mechanical couplings with the filter medium, which may bring the filter medium in vibration, are also conceivable.

FIGS. 4 through 7 show a second exemplary embodiment of a particle filter. An outer housing made-up of stainless steel has an outer wall 25, a cap 26 removable from outer wall 25 and a bottom section, which has a gas outlet 15. On cap 26, a housing section is situated, which forms a cold trap 2 running into a gas line 12, which comes from a CVD reactor.

The housing of the particle filter is, by means of two mounting brackets 33 situated in a diametrically opposite manner, attached to a support arm 35 of a holding device 32. Mounting brackets 33 are connected via an elastic rubber buffer 34 to support arm 35. Support arm 35 is situated at a support column 36. Rubber buffers 34 are capable of damping vertical movements of particle separation housing 3.

Figure 5:
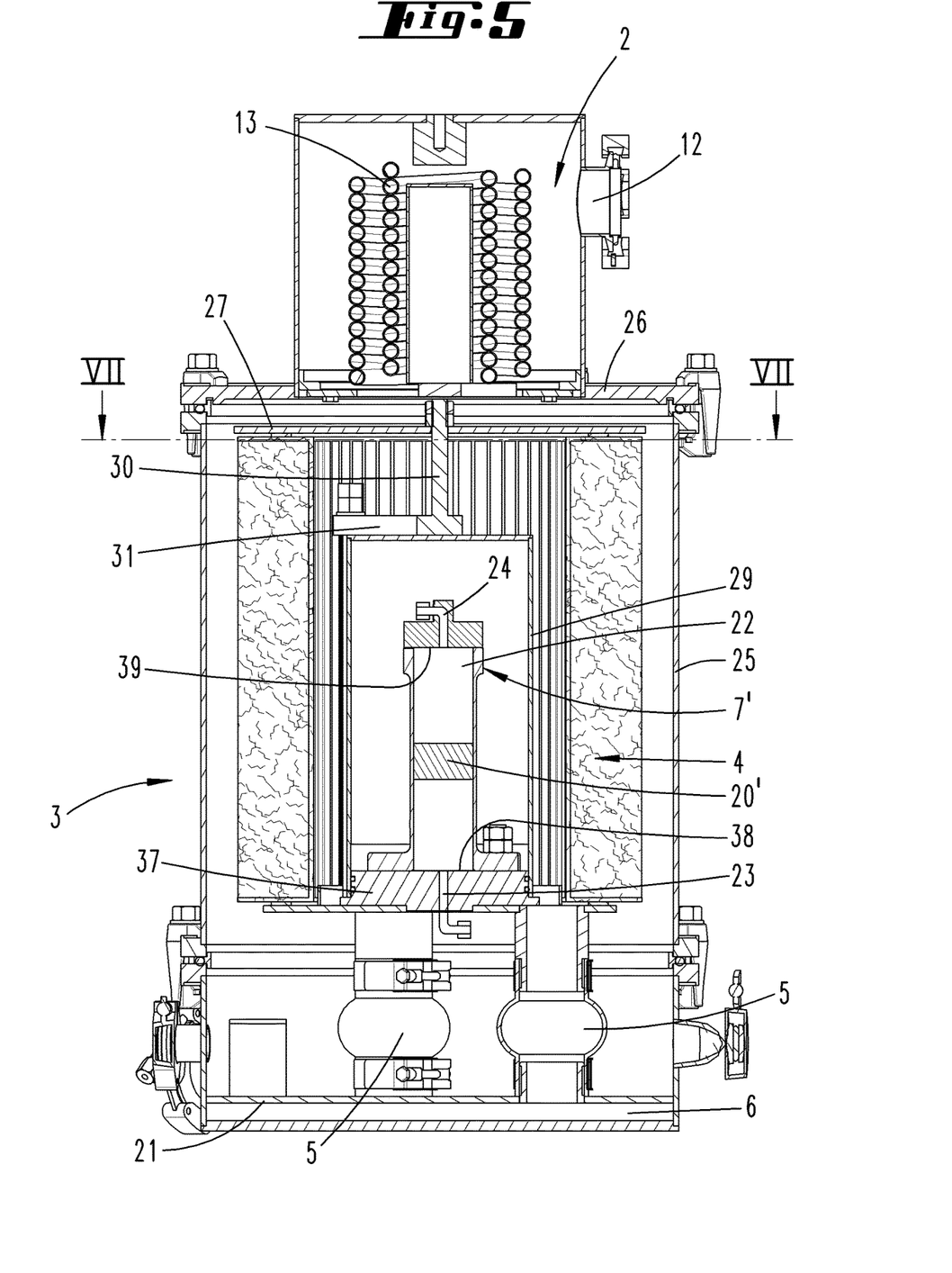
FIG. 5 shows a longitudinal section through the particle separator illustrated in FIG. 4 along cutting line V-V in FIG. 7.
Figure 6:
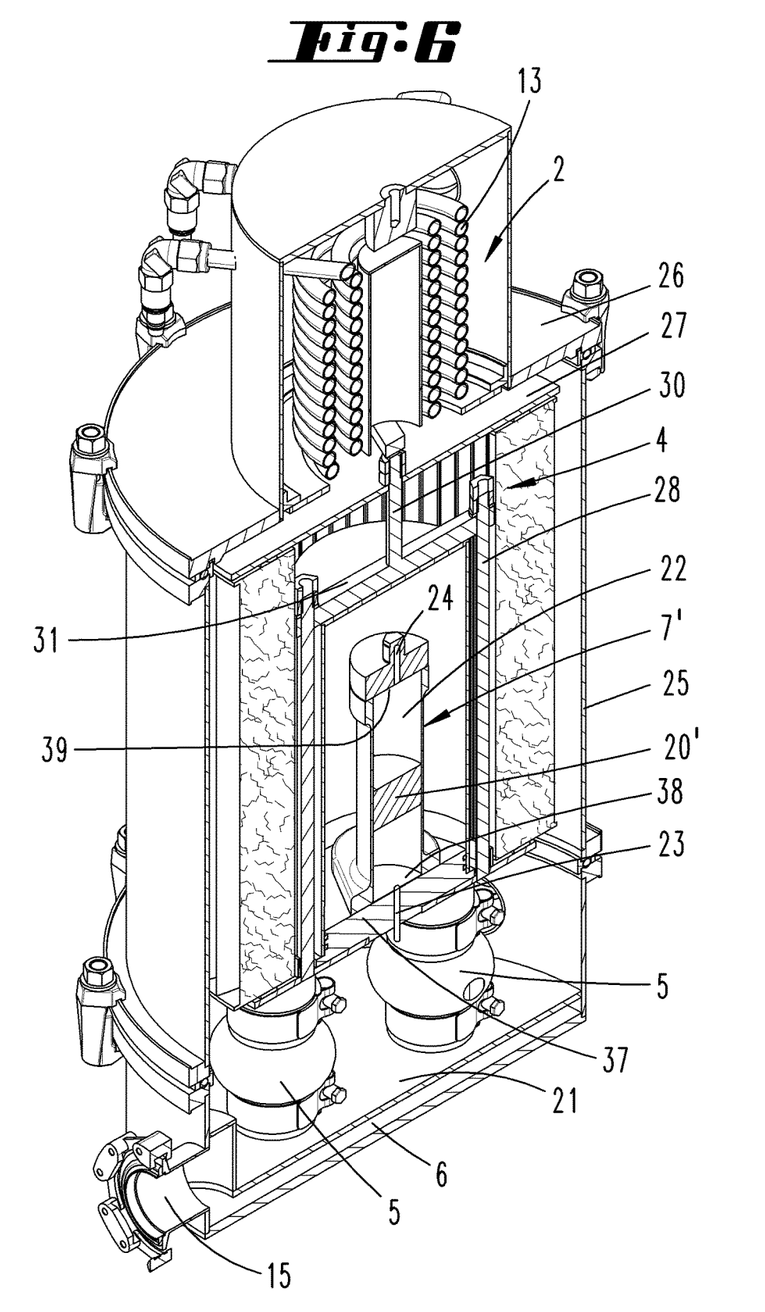
FIG. 6 shows a perspective view of a cut-open particle separator along cutting line VI-VI in FIG. 7.
Figure 7:
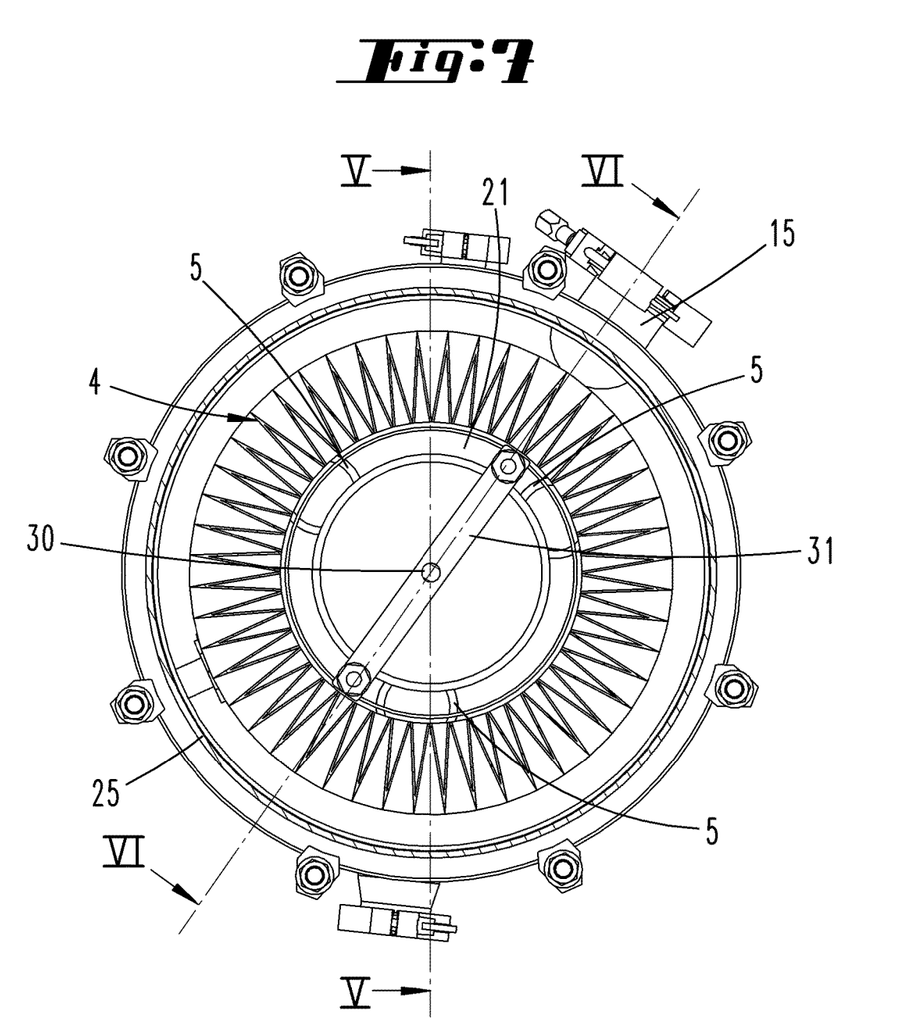
FIG. 7 shows the section according to line VII-VII in FIG. 5.

The upper section of particle separation housing 3 forms mentioned cold trap 2. A cooling coil 13 is located within the housing section forming cold trap 2. Exhaust gases entering through gas line 12 into cold trap 2 are cooled by cooling coil 13, so that gases or liquids from the exhaust gas may condense into solid bodies.

Downstream of cold trap 2, a cavity surrounded by outer wall 25 is located underneath cool trap 2. This cavity is upwardly bounded by cap 26, which has passage openings, through which the gas coming from cold trap 2 may enter the cavity surrounded by outer wall 25.

A particle separator in the form of a single filter cartridge 4 is located within cavity 25. The membrane of filter cartridge 4 has been described above, so that at this point reference is made to the statements recited there. A plurality of filter cartridges may, however, also be situated next to one another.

A mass acceleration device in form of a hammer device 7' is located in the interior of filter cartridge 4, which is attached at its lower end to a base body 37. Hammer device 7' is connected to base body 37 designed as a base plate. In turn, base body 37 is connected by means of three silicone bellows 5 to bottom 21 of the cavity. Silicone bellows 5 are capable to deform in the vertical direction, so that base body 37 and filter cartridge 4 attached thereto may move in the vertical direction.

Silicone bellows 5 form gas outlet lines and are flow-connected to the interior of filter cartridge 4. They connect the internal volume of filter cartridge 4 to a gas outlet channel 6, which is located below a bottom 21. This gas outlet channel 6 runs into gas outlet 15.

Hammer device 7' has a cylindrical body having a cylindrically shaped cavity 22. A mass 20', which is displaceable in the vertical direction within cavity 22, is located in cylindrically shaped cavity 22. Bottom side 38 of cavity 22, which is formed by base body 37, forms an anvil, upon which mass 20' may fall, when it is lifted by a gas stream, which is fed through an air inlet channel 23 into the space below mass 20'. The air below mass 20' may, by opening a valve situated in air inlet channel 23, escape from cavity 22, so that the falling mass 20' falls down and transfers an impulse to base body 37 or filter cartridge 4 in such a manner that the conglomerates adhering to the wall of the filter membrane loosen from the wall.

Cavity 22 is upwardly bounded by a cap, which has an air outlet channel 24. Mass 20' may strike this cap, when it is pneumatically lifted. Underside 39 of the cap thus also forms an anvil.

A holding frame 28 having two vertical struts, between which an interior housing 29 extends, is situated within the cavity of filter cartridge 4. Falling mass device 7' is situated within interior housing 29 in such a way that it is capsuled in a gas-tight manner from the filtered process gases.

The two vertical struts of holding frame 28 are connected with each other by a crossbar 31. A threaded rod 30 carrying a cover plate 27 projects upwards from crossbar 31. In the exemplary embodiment shown in the drawings, mass 20' forms a falling mass and the hammer assembly forms a drop hammer assembly. It is, however, also possible to bring mass 20' in a vertical vibration, in order to vibrate cartridge 4. In an exemplary embodiment not shown, the hammer assembly may also have a mass displaceable in the horizontal direction.

The preceding embodiments serve to illustrate the inventions comprehensively covered by the application, which each independently further refine the related art at least by the following combinations of features, namely:

A device, characterized by the fact that the pore size and the surface quality of filter medium 16 is selected in such a manner that the particles located in the exhaust gas stream adhere to the surface of filter medium 16, however, do not penetrate filter medium 16 and the particles grow to conglomerates outside of filter medium 16, and means for cleaning particle filter 4 by mechanically removing the conglomerates are further provided.

A device, characterized by the fact that filter medium 16 is paper, plastic or a nonwoven polymer fabric and/or that filter medium 16 is coated, in particular, is coated with Teflon.

A device, characterized by the fact that the pore size ranges between 1 and 50 μm, preferably ranges between 5 and 20 μm.

A device, characterized by the fact that the means include a mass acceleration device 7, 7', by which particle filter 4 is able to be set in motion, and the mass acceleration device is particularly a vibration device 7, which has a flywheel mass 20, or a hammer device 7' having a mass 20' striking an anvil 38, 39.

A device, characterized by the fact that the means are capable of deforming filter medium 16 of particle filter 4 particularly in an elastic manner or that the means are capable of generating a pressure surge, in particular, on the downstream side of filter medium 16.

A device, characterized by the fact that particle filter 4 has one or a plurality of elastically mounted filter cartridges, which extend in the vertical direction, and it is particularly provided that the at least one filter cartridge is connected at its bottom side by an elastic bearing element 5 to particle separator housing 3 and it is particularly provided that vibration device 7 is situated at the preferably free-swingable upper side of the at least one filter cartridge or that a hammer device, having a mass 20', which preferably impulse-loads the filter cartridge in the vertical direction, is preferably provided within filter cartridge 4.

A device, characterized by the fact that the at least one filter cartridge extends in the vertical direction and mass acceleration device 7, 7' is rigidly attached to filter cartridge 4.

A device, characterized by the fact that a base body 37 is connected by elastic bearing element 5 to particle separator housing 3 and supports the at least one filter cartridge 4 and hammer device 7', and hammer device 7' is preferably disposed in the interior of filter cartridge 4.

A device, characterized by the fact that mass acceleration device 7, 7' formed as drop hammer device 7' has a cavity 22, in which a mass 20' movable in the vertical direction is located, which is particularly lifted pneumatically in order to fall onto an anvil formed by bottom 38 of cavity 22 or in order to strike a ceiling 39 of cavity 22 and to transfer an impulse to particle filter 4.

A device, characterized by the fact that vibration device 7 includes an electric motor 19, which rotates flywheel masses 20 situated excentrically to the rotary axis and/or that vibration device 7 includes an ultrasonic exciter and/or that a plurality of filter cartridges 4 disposed, in particular, parallel to one another are vibrated by a single vibration device 7, and vibration device 7 particularly firmly connects the upper sides of a plurality of filter cartridges 4 with one another and/or that filter cartridge 4 is formed by a hollow cylinder, which wall is formed by filter medium 16.

A device, characterized by the fact that filter medium 16 is pleated having score lines 17, 18 running in the axial direction of filter cartridge 4.

A device, characterized by the fact that the foot of filter cartridge 4 is formed by at least one silicone bellow 5, through which the filtered gas stream exits filter cartridge 4 and which enables a vertical movement of filter cartridge 4 vis-à-vis particle separator housing 3, and/or that a plurality of, in particular, three filter cartridges 4 situated in a parallel manner to one another are respectively connected by a silicone bellow in such a manner to particle separator housing 3 that they are able to carry out a pendulous vibration about silicone bellow 5 and/or that particle filter 4 is attached to a bottom of particle separator housing 3, and the bottom forms a collecting surface for the conglomerates.

A device, characterized by the fact that the means are capable of generating a gas pressure on the downstream side of filter medium 16, which is greater than the upstream gas pressure and/or of generating a gas flow against the exhaust gas stream through filter medium 16 and/or that the means include mechanical excitation members, in order to affect an elastic deformation of the filter material.

A use that is characterized by the fact that particle filter 4 and/or filter medium 16 are able to be set in motion, in particular, be brought in vibration vis-à-vis particle separator housing 3, particularly by a mass acceleration device 7, 7' or by an additional gas supply in such a manner that conglomerates forming at the surface of filter medium 16 of particle filter 4 and made-up of particles included in the exhaust gas stream are shaken off from the filter medium, so that conglomerates collect in the area of a bottom 21 of particle separator housing 3, and the size of the conglomerates is in the millimeter range, in particular, the average diameter of the conglomerates ranges between 0.5 and 5 mm.

All disclosed features are (separately, but also in combination with one another) substantial to the present invention. For this purpose, the disclosure content of the associated/ appended priority documents (copy of prior application) is included in full in the disclosure of the application, also for the purpose of including features of these documents in the claims of the present application. The dependent claims independently characterize refinements according to the present invention of the related art, in particular, to carry out divisional applications on the basis of these claims.

LIST OF REFERENCE CHARACTERS

1 CVD reactor
2 Cold trap
3 Particle separator housing
4 Filter cartridge
5 Silicone bellow
6 Gas outlet channel
7 Vibration device
7' Hammer device
8 Process chamber
9 Susceptor
10 Gas outlet member
11 Gas inlet member
12 Gas line
13 Cooling coil
14 Housing
15 Gas outlet
16 Filter medium
17 Score line
18 Score line
19 Electric motor
20 Flywheel mass
20' Mass
21 Bottom
22 Cavity
23 Air inlet channel
24 Air outlet channel
25 Outer wall, cavity
26 Cap
27 Cover plate
28 Holding frame
29 Interior housing
30 Threaded rod
31 Crossbar
32 Holding device
33 Mounting bracket
34 Rubber buffer
35 Support arm
36 Support column
37 Base body
38 Anvil
39 Anvil

What is claimed is:

1. A device for coating substrates in a process chamber of a reactor housing, having a gas inlet member for introducing process gases into the process chamber, having a gas outlet member for discharging an exhaust gas stream from the process chamber into a particle filter, which is situated in a particle separator housing and has a porous filter medium, for out-filtering particles formed during a reaction of the process gases from the exhaust gas stream, wherein the pore size and the surface quality of the filter medium are configured in such a manner that the particles located in the exhaust gas stream adhere to the surface of the filter medium, however do not penetrate the filter medium, and the particles grow into conglomerates outside of the filter medium, wherein a mass acceleration device is further provided for cleaning the particle filter by mechanically removing the conglomerates, characterized in that the particle filter is formed by a filter cartridge and the mass acceleration device is a hammer device having a mass, which impulse-loads the filter cartridge in a vertical direction.

2. The device according to claim 1, characterized in that the filter medium is paper, plastic or a nonwoven polymer fabric and/or that the filter medium is coated with Teflon.

3. The device according to claim 1, characterized in that the pore size ranges between 1 and 50 μm.

4. The device according to claim 1, characterized in that the mass strikes an anvil.

5. The device according to claim 1, further characterized in that the filter cartridge is connected at its underside by an elastic bearing element to the particle separator housing.

6. The device according to claim 1, further characterized in that the mass acceleration device is rigidly attached to the filter cartridge.

7. The device according to claim 1, further characterized in that the filter cartridge extends in the vertical direction.

8. The device according to claim 5, further characterized in that a base body is connected by the elastic bearing element to the particle separator housing and supports the filter cartridge and the mass acceleration device.

9. The device according to claim 1, further characterized in that the mass acceleration device is situated in an interior of the filter cartridge.

10. The device according to claim 1, further characterized in that the hammer device is formed as a drop hammer device and has a cavity, in which the mass movable in the vertical direction is located.

11. The device according to claim 10, further characterized in that the mass is operable to be pneumatically lifted in order to fall onto an anvil formed by a bottom of the cavity or in order to strike a ceiling of the cavity to transfer an impulse to the particle filter.

12. The device according to claim 1, further characterized in that the filter cartridge is formed by a hollow cylinder, a wall of which is formed by the filter medium, which is pleated having score lines, which extend in an axial direction of the filter cartridge.

13. The device according to claim 1, further characterized in that the particle filter is attached to a bottom of the particle separator housing, wherein the bottom of the particle separator housing forms a collecting surface for conglomerates.

14. The device according to claim 3, characterized in that the pore size ranges between 5 and 20 µm.

* * * * *